(12) United States Patent
Fukushima et al.

(10) Patent No.: US 9,018,658 B2
(45) Date of Patent: Apr. 28, 2015

(54) OPTICAL SEMICONDUCTOR PACKAGE AND METHOD OF MANUFACTURING THE SAME

(75) Inventors: Sumitaka Fukushima, Kyoto (JP); Hiroyuki Sakamoto, Kyoto (JP); Hayato Takagi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 130 days.

(21) Appl. No.: 13/703,996

(22) PCT Filed: May 30, 2012

(86) PCT No.: PCT/JP2012/003521
§ 371 (c)(1),
(2), (4) Date: Dec. 13, 2012

(87) PCT Pub. No.: WO2012/169147
PCT Pub. Date: Dec. 13, 2012

(65) Prior Publication Data
US 2013/0134468 A1    May 30, 2013

(30) Foreign Application Priority Data

Jun. 7, 2011 (JP) .................................. 2011-126818

(51) Int. Cl.
*H01L 33/00* (2010.01)
*H01L 33/60* (2010.01)
*H01L 33/48* (2010.01)
*H01L 33/62* (2010.01)

(52) U.S. Cl.
CPC ......... *H01L 33/60* (2013.01); *H01L 2933/0033* (2013.01); *H01L 33/486* (2013.01); *H01L 33/62* (2013.01); *H01L 2224/48091* (2013.01); *H01L 2224/48247* (2013.01)

(58) Field of Classification Search
None
See application file for complete search history.

(56) References Cited

U.S. PATENT DOCUMENTS

| | | | | |
|---|---|---|---|---|
| 5,877,559 | A * | 3/1999 | Takayama et al. | 257/773 |
| 5,985,465 | A * | 11/1999 | Daichou et al. | 428/458 |
| 6,608,334 | B1 * | 8/2003 | Ishinaga | 257/100 |
| 2002/0063301 | A1 * | 5/2002 | Hanamoto et al. | 257/432 |
| 2003/0003629 | A1 * | 1/2003 | Koike et al. | 438/124 |
| 2003/0236388 | A1 * | 12/2003 | Armstrong et al. | 528/408 |
| 2007/0164408 | A1 * | 7/2007 | Yeh et al. | 257/676 |
| 2008/0187762 | A1 * | 8/2008 | Hayashi et al. | 428/413 |
| 2009/0212684 | A1 * | 8/2009 | Saito et al. | 313/498 |
| 2010/0289048 | A1 * | 11/2010 | Kumura | 257/98 |
| 2011/0241055 | A1 * | 10/2011 | Urasaki et al. | 257/98 |

FOREIGN PATENT DOCUMENTS

| | | |
|---|---|---|
| JP | 58-068992 | 4/1983 |
| JP | 10-095910 | 4/1988 |
| JP | 11-087780 | 3/1999 |
| JP | 2002-249636 | 9/2002 |

(Continued)

*Primary Examiner* — Bilkis Jahan
*Assistant Examiner* — Kevin Quinto
(74) *Attorney, Agent, or Firm* — Hamre, Schumann, Mueller & Larson, P.C.

(57) ABSTRACT

In an optical semiconductor package, a method of manufacturing the same, and an optical semiconductor device according to the present invention, a thermosetting resin such as an unsaturated polyester resin is used for a reflector 5 or resin 6 exposed around an optical semiconductor element, thereby suppressing deterioration of resin and a reduction in reflectivity.

2 Claims, 5 Drawing Sheets

(56) References Cited

FOREIGN PATENT DOCUMENTS

| JP | 2004-251950 | 9/2004 |
| JP | 2006-156704 | 6/2006 |
| JP | 2006-157034 | 6/2006 |
| JP | 2007-138017 | 6/2007 |
| JP | 2011-103437 | 5/2011 |
| WO | WO 2010/082660 | 7/2010 |

* cited by examiner

OPTICAL SEMICONDUCTOR PACKAGE AND METHOD OF MANUFACTURING THE SAME

TECHNICAL FIELD

The present invention relates to an optical semiconductor package in which leads are held by resin and a mounting region for an optical semiconductor element is provided on the lead, a method of manufacturing the same, and an optical semiconductor device.

BACKGROUND ART

An optical semiconductor package includes a plurality of leads and resin for holding the leads. The leads are classified as a lead for mounting an optical semiconductor element and at least one lead that acts as an external terminal and is electrically connected to the terminals of the mounted optical semiconductor element. The optical semiconductor package may include a reflector that surrounds at least the mounting region of the optical semiconductor element.

The reflector may be made of the same resin as the resin for holding the leads or a different resin. The reflector is provided to reflect light emitted from the optical semiconductor element so as to improve the luminous efficiency of light emitted from an optical semiconductor device. Hence, at least the reflector is generally made of a thermoplastic resin having a high reflectivity of light (for example, see Patent Literature 1).

Conventionally, optical semiconductor packages have been produced by injection molding because a thermoplastic resin has a high viscosity and low flowability. In this case, for example, a mold is set at about 150° C. to 200° C. and resin is set at about 300° C. to 330° C. before injection. The resin is injected into the mold and then is cured by cooling. The thermoplastic resin has high water absorption of about 3% to 1% and thus the thermoplastic resin containing absorbed water is hydrolyzed during injection molding. For this reason, the thermoplastic resin is dried before injection molding.

CITATION LIST

Patent Literature

Patent Literature 1: Japanese Patent Laid-Open No. 11-87700

SUMMARY OF INVENTION

Technical Problem

In the case of a reflector made of a thermoplastic resin, unfortunately, the thermoplastic resin is deteriorated and discolored by, for example, ultraviolet rays contained in emitted light during a long light-emitting operation, leading to a lower reflectivity during the use of the reflector. For example, in the case where the thermoplastic resin is polyamide, the thermoplastic resin contains 50% to 70% of aromatic components, 10% to 40% of titanium oxide, and 10% to 20% of glass fibers. In this case, the resin is discolored by light emitted from the optical semiconductor device at 150° C. for 1000 hours, reducing the reflectivity to 70% or less.

In recent years, as optical semiconductor elements have increased in power, it has been increasingly necessary to prevent deterioration of a reflector from reducing a reflectivity.

In order to solve the problem, an object of the present invention is to reduce deterioration of resin so as to suppress a reduction in the reflectivity of emitted light.

Solution to Problem

In order to attain the object, an optical semiconductor package according to the present invention includes: a first lead having a mounting region for an optical semiconductor element on the major surface of the first lead; at least one second lead having a connecting region for a conductive material on the major surface of the second lead, the conductive material being used for conduction with the optical semiconductor element; and holding resin that holds the first lead and the second lead, wherein the holding resin exposed at least around the mounting region is a thermosetting resin.

The optical semiconductor package further includes a reflector formed on the major surfaces of the first lead and the second lead by opening at least the mounting region and the connecting region, wherein the reflector may be made of a thermosetting resin.

The thermosetting resin is preferably a resin containing no aromatic components.

The thermosetting resin may be one of an epoxy resin, a silicone resin, and a modified silicone resin.

The thermosetting resin is preferably a cycloaliphatic epoxy resin.

The thermosetting resin is preferably an unsaturated polyester resin.

The unsaturated polyester resin preferably contains a filler composed of glass fibers and spherical silica.

The unsaturated polyester resin preferably contains titanium oxide.

The unsaturated polyester resin preferably contains a filler composed of glass fibers and spherical silica, titanium oxide, and any additive agent and satisfies: 15%<A<25%, 5%<B<20%, 30%<C<40%, 20%<D<30%, 1%<E<3%, and A+B+C+D+E=100% where A is the component ratio of the unsaturated polyester resin, B is the component ratio of the glass fibers, C is the component ratio of the titanium oxide, D is the component ratio of the silica, and E is the component ratio of the additive agent.

A method of manufacturing an optical semiconductor package according to the present invention is a method of manufacturing the optical semiconductor package, the method including: placing the first lead and the second lead in a mold; pouring the thermosetting resin into the mold to mold one of the holding resin and the reflector by transfer molding; and curing the thermosetting resin, wherein the thermosetting resin is one of an epoxy resin and a cycloaliphatic epoxy resin.

A method of manufacturing an optical semiconductor package according to the present invention is a method of manufacturing the optical semiconductor package, the method including: placing the first lead and the second lead in a mold; injecting the thermosetting resin into the mold to mold one of the holding resin and the reflector by injection molding; and curing the thermosetting resin, wherein the thermosetting resin is one of a silicone resin, a modified silicone resin, and an unsaturated polyester resin.

Preferably, the mold is kept at 150° C. to 200° C. and the thermosetting resin heated to 50° C. to 90° C. is poured or injected into the mold.

An optical semiconductor device according to the present invention includes: the optical semiconductor package; the optical semiconductor element mounted in the mounting region; the conductive material electrically connecting the terminals of the optical semiconductor element and the connecting region; and a lens that is formed on the major surfaces of the first lead and the second lead so as to cover at least the optical semiconductor element and the conductive material.

An optical semiconductor device according to the present invention includes: the optical semiconductor package; the optical semiconductor element mounted in the mounting region; the conductive material electrically connecting the terminals of the optical semiconductor element and the connecting region; and a translucent resin that seals the optical semiconductor element and the conductive material in the opening of the reflector.

The thermosetting resin is preferably one of an epoxy resin, a cycloaliphatic epoxy resin, a silicone resin, a modified silicone resin, and an unsaturated polyester resin.

Advantageous Effects of Invention

As has been discussed, a thermosetting resin such as an unsaturated polyester resin is used as a reflector or resin exposed around an optical semiconductor element, thereby suppressing deterioration of the resin and a reduction in reflectivity.

DESCRIPTION OF EMBODIMENTS

Embodiments of an optical semiconductor package, a method of manufacturing the same, and an optical semiconductor device according to the present invention will be described below with reference to the accompanying drawings.

First Embodiment

Referring to FIGS. 1 and 2, the configuration of an optical semiconductor package according to a first embodiment will be first described below.

Figure 1A:
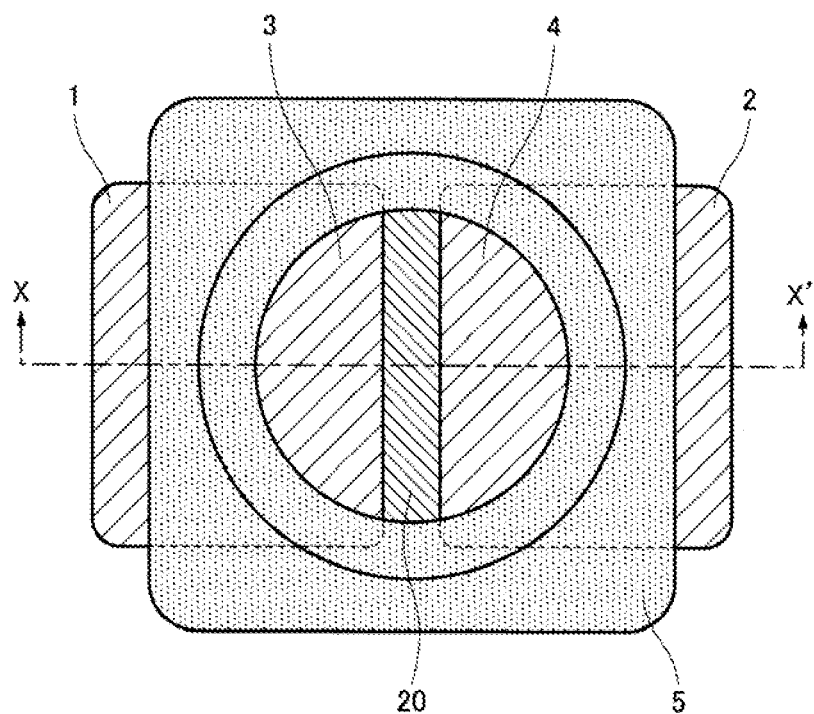
FIG. 1 is an explanatory drawing illustrating the configuration of an optical semiconductor package provided with a reflector according to a first embodiment.
Figure 1B:
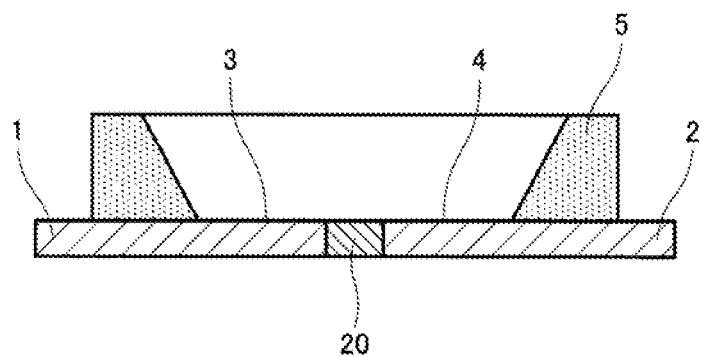
Figure 2A:
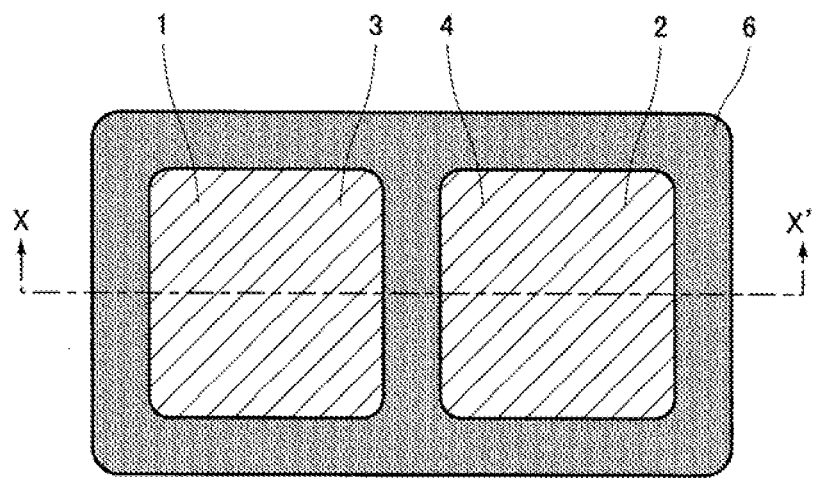
FIG. 2 is an explanatory drawing illustrating the configuration of an optical semiconductor package not provided with a reflector according to the first embodiment.
Figure 2B:
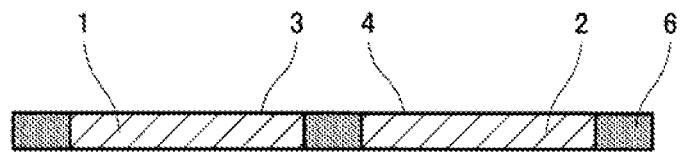

FIG. 1 is an explanatory drawing illustrating the configuration of an optical semiconductor package provided with a reflector according to the first embodiment. FIG. 1(a) is a plan view and FIG. 1(b) is a cross-sectional view taken along arrows X-X' of FIG. 1(a). FIG. 2 is an explanatory drawing illustrating the configuration of an optical semiconductor package not provided with a reflector according to the first embodiment. FIG. 2(a) is a plan view and FIG. 2(b) is a cross-sectional view taken along arrows X-X' of FIG. 2(a).

As illustrated in FIG. 1, the optical semiconductor Package used for an optical semiconductor device includes leads 1 and 2 acting as external terminals, holding resin 20 that holds the leads 1 and 2, and a reflector 5. The lead 1 acts as an external terminal and has a mounting region 3 for mounting an optical semiconductor element on the major surface of the lead 1. The lead 2 includes at least one lead acting as an external terminal having a connecting region 4 on the major surface of the lead 2, the connecting region 4 being electrically connected to the terminals of the optical semiconductor element. The reflector 5 has the function of reflecting emitted light from the optical semiconductor element in the outward direction of the optical semiconductor device. Thus, the mounting region 3 of the lead 1 and the connecting region 4 of the lead 2 are opened, and the reflector 5 is formed on the major surfaces having the mounting region 3 and the connecting region 4 of the leads 1 and 2, the reflector 5 surrounding the mounting region 3 and the connecting region 4. Moreover, the reflector 5 for reflecting emitted light needs to have a high reflectivity at least in the opening.

As illustrated in FIG. 2, the optical semiconductor package may not have a reflector. Specifically, resin 6 is formed around the lead 1 having the mounting region 3 and the lead 2 having the connecting region 4 such that the resin 6 holds the leads 1 and 2 while electrically isolating the leads 1 and 2. The resin 6 needs to have a high reflectivity at least in a part exposed around the mounting region 3.

Conventionally, in some cases, ceramics having a high reflectivity of light and high resistance to deterioration are used for the reflector 5 and so on. Unfortunately, ceramics are expensive and may cause difficulty in inserting leads and reducing a thermal resistance value.

A feature of the optical semiconductor package according to the first embodiment is a thermosetting resin used for forming the reflector 5 or the resin 6.

A conventionally used thermoplastic resin is a linear polymer whose molecular main and side chains are likely to be cut by heat. Bond energy between carbons of a thermoplastic resin is lower than an ultraviolet wavelength, causing the thermoplastic resin to be susceptible to ultraviolet rays. In contrast, a thermosetting resin has a strong bonding structure such as a network structure and thus the atomic structure of the thermosetting resin is not easily broken by heat or UV radiation, leading to high resistance to deterioration.

The reflector 5 or the resin 6 made of a thermosetting resin that has high reflection efficiency and high resistance to deterioration against ultraviolet rays or the like. Even in the case where light is emitted for a long time from the optical semiconductor device including the optical semiconductor element mounted in the optical semiconductor package according to the first embodiment, deterioration of the reflector 5 or the resin 6 and discoloration caused by deterioration can be suppressed, thereby keeping a high reflectivity and a high rate of emission. Particularly, the composition of a thermosetting resin can be easily changed and an aromatic component can be separated from the thermosetting resin. Thus, the thermosetting resin may contain no aromatic components. A thermosetting resin containing no aromatic components can improve resistance to deterioration.

The reflector 5, the resin 6, and the holding resin 20 for holding the leads 1 and 2 may be made of the same thermosetting resin. Alternatively, only a surface in the opening of the reflector 5 or the exposed part of the resin 6 around the mounting region 3 may be made of a thermosetting resin.

Second Embodiment

According to an optical semiconductor package of a second embodiment, an epoxy resin, a silicone resin, and a modified silicone resin are used as thermosetting resins in the optical semiconductor package of the first embodiment.

These resins have high reflection efficiency and high resistance to deterioration against ultraviolet rays or the like. Thus, even in the case where an optical semiconductor device is caused to emit light for a long time, deterioration of a reflector or the resin and discoloration caused by deterioration can be suppressed, thereby keeping a high reflectivity and a high rate of emission.

Specifically, since an epoxy resin has a network structure, the composition of the epoxy resin can be easily changed and an aromatic component can be separated from the epoxy resin so as to form, for example, a cycloaliphatic epoxy resin containing no aromatic components. A cycloaliphatic epoxy resin containing no aromatic components does not have a carbon-to-carbon bond, thereby reducing the influence of ultraviolet rays. Since the network structure of the epoxy resin is stronger than the structure of a thermoplastic resin, molecular main and side chains are not easily cut by heat, improving resistance to deterioration.

Similarly, a silicone resin has a molecular structure that is a spiral structure having a larger binding force than the binding of a typical polymer, for example, a liner polymer or a network structure, achieving excellent heat resistance and weather resistance and improved resistance to deterioration.

Figure 3A:
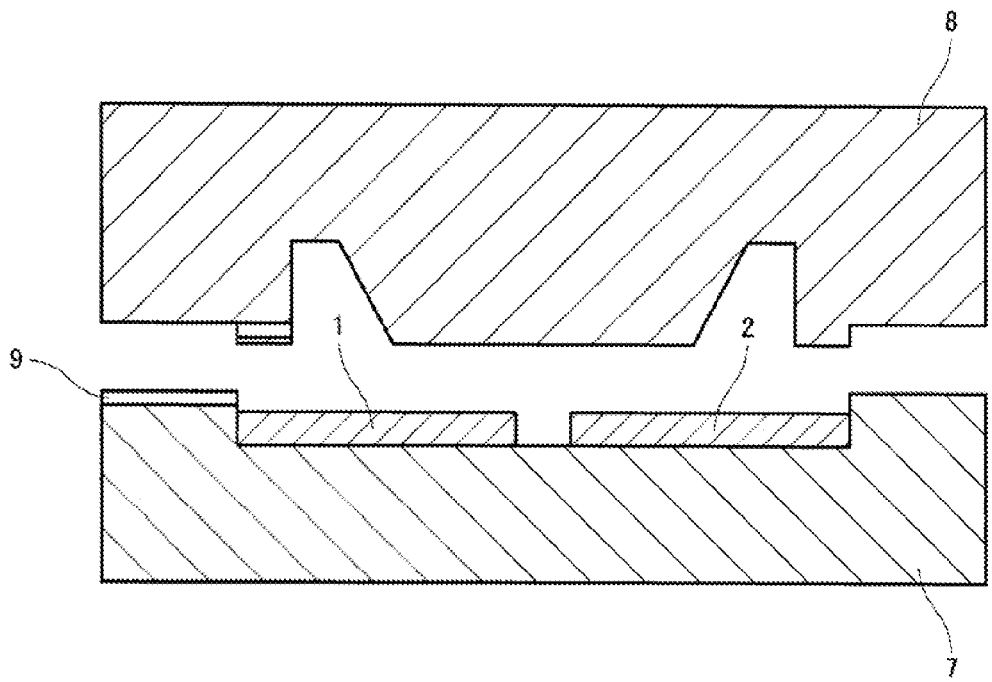
FIG. 3 is a process sectional view illustrating a method of manufacturing the optical semiconductor package by transfer molding.
Figure 3B:
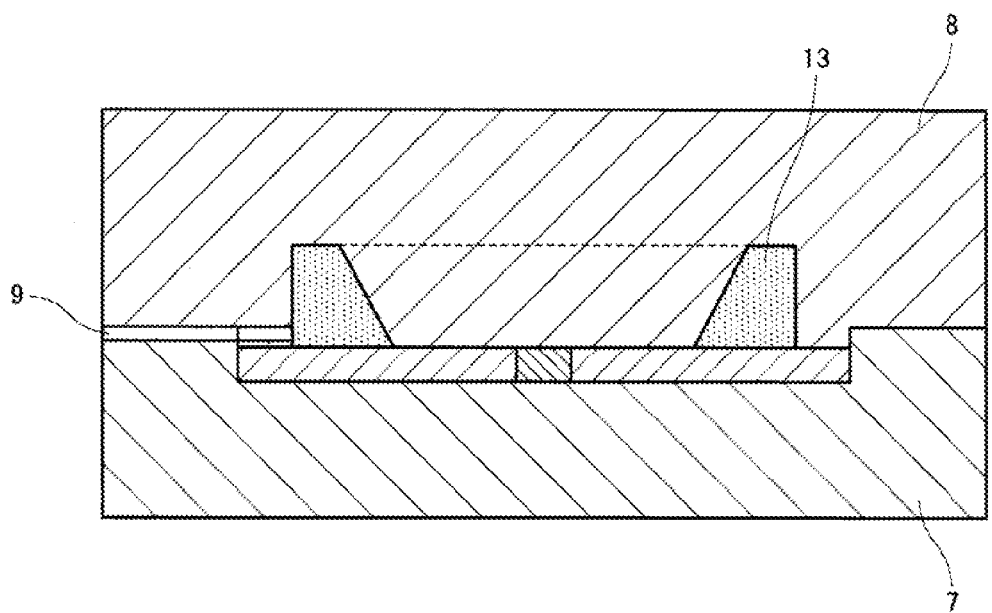

Referring to FIG. 3, a method of manufacturing the optical semiconductor package will be described below. In this case, thermosetting resins are an epoxy resin, a silicone resin and a modified silicone resin.

FIG. 3 is a process sectional view illustrating the method of manufacturing the optical semiconductor package by transfer molding.

First, a mold with an inlet, port 9 for resin 13 is prepared so as to contain the formation regions of leads 1 and 2, holding resin, and the reflector. After that, the leads 1 and 2 are placed at predetermined positions in a drag 7 of the mold (FIG. 3(a)).

The drag 7 and a cope 8 are then joined to each other and a molten epoxy resin or the like is injected into the mold from the inlet port 9. At this point, for example, the temperature of the mold is set at about 150° C. to 200° C. and the temperature of the resin 13 is set at about 50° C. to 90° C. (FIG. 3(b)).

Figure 3C:
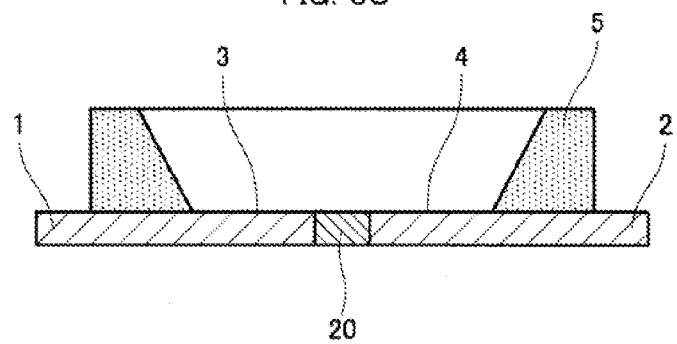

Finally, the resin 13 is cured by heating at the temperature of the mold, and then a molded product is removed from the mold (FIG. 3(c)).

In this way, the optical semiconductor package can be formed with a reflector 5 made of an epoxy resin, a silicone resin, and a modified silicone resin that have high reflection efficiency and high resistance to deterioration against ultraviolet rays or the like. Thus, even in the case where the optical semiconductor device is caused to emit light for a long time, deterioration of resin and discoloration caused by deterioration can be suppressed, thereby keeping a high reflectivity and a high rate of emission.

In this embodiment, the reflector and holding resin 20 are molded together. The reflector 5 and the holding resin 20 may be separately molded using different materials.

Also in the case of the formation of resin 6 in an optical semiconductor package not provided with a reflector as illustrated in FIG. 2, the optical semiconductor package can be formed by transfer molding with a suitable mold.

Third Embodiment

A feature of an optical semiconductor package according to a third embodiment is that a thermosetting resin is an unsaturated polyester resin in the optical semiconductor package of the first embodiment. An unsaturated polyester resin also has high reflection efficiency and high resistance to deterioration against ultraviolet rays or the like. Thus, even in the case where an optical semiconductor device is caused to emit light for a long time, deterioration of a reflector or the resin and discoloration caused by deterioration can be suppressed, thereby keeping a high reflectivity and a high rate of emission.

Figure 4A:
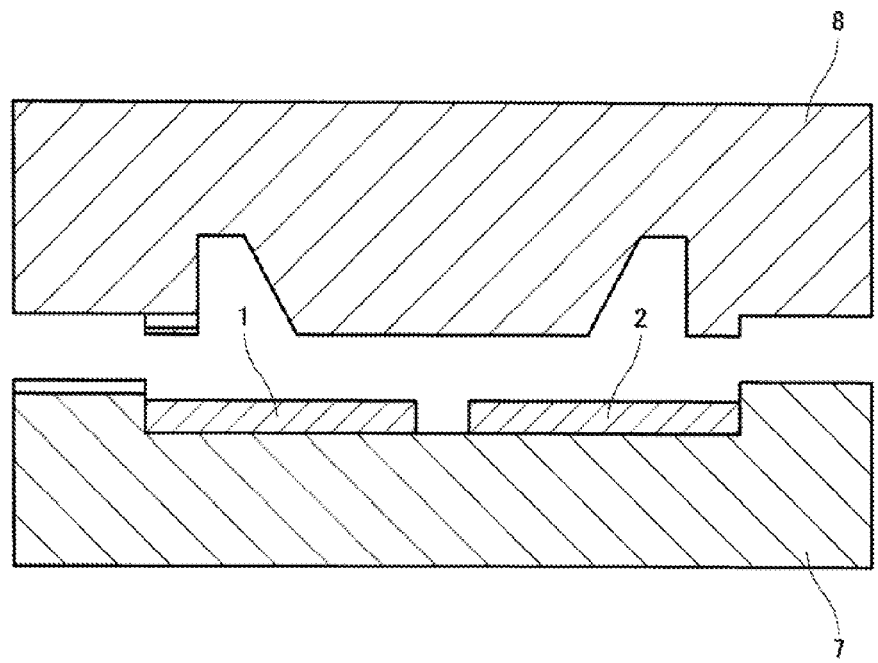
FIG. 4 is a process sectional view illustrating a method of manufacturing the optical semiconductor package by injection molding.
Figure 4B:
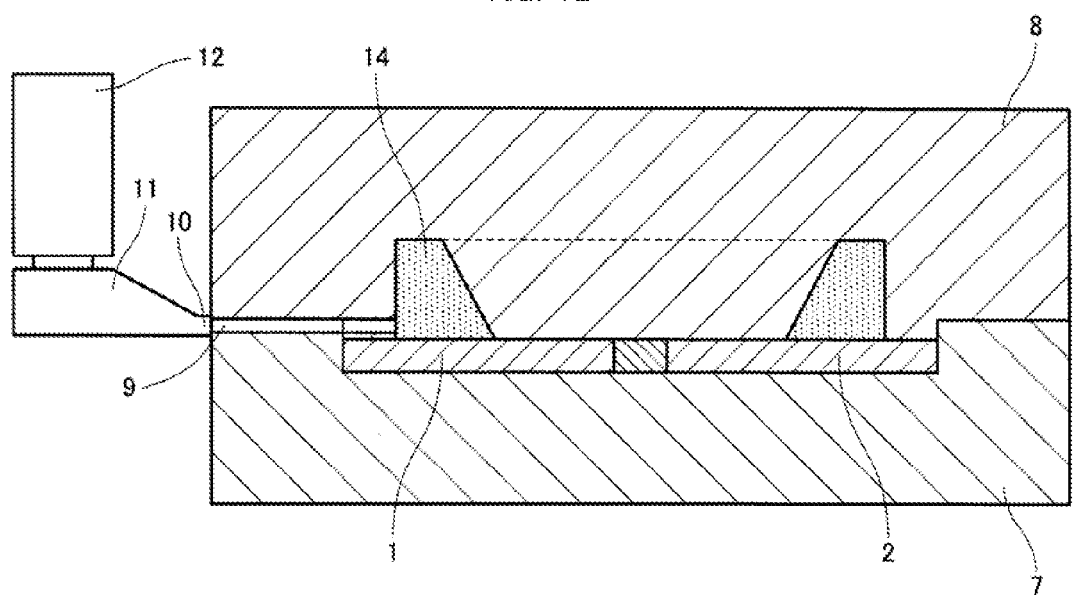

Referring to FIG. 4, a method of manufacturing the optical semiconductor package will be described below. In this case, a thermosetting resin is an unsaturated polyester resin.

FIG. 4 is a process sectional view illustrating the method of manufacturing the optical semiconductor package by injection molding.

First, a mold with an inlet port 9 for resin 14 is prepared so as to contain the formation regions of leads 1 and 2, holding resin, and the reflector. After that, the leads 1 and 2 are placed at predetermined positions in a drag 7 of the mold (FIG. 4(a)).

The drag 7 and a cope 8 are then joined to each other, and a nozzle 10 provided on one end of a cylinder 11 is inserted into the inlet port 9. The cylinder 11 is connected to a hopper 12 that holds the molten unsaturated polyester resin 14. The molten unsaturated polyester resin 14 is pressurized and injected into the mold from the inlet port 9 through the cylinder 11. At this point, for example, the pelletized unsaturated polyester resin is heated to 50° C. to 90° C. in the hopper 12 and then is melted and kneaded by a screw in the cylinder 11. After that, the unsaturated polyester resin 14 is immediately injected into the mold, which is heated to 150° C. to 200° C., through the nozzle 10 with an injection pressure of 80 Mpa to 250 Mpa (FIG. 4(b)).

Figure 4C:
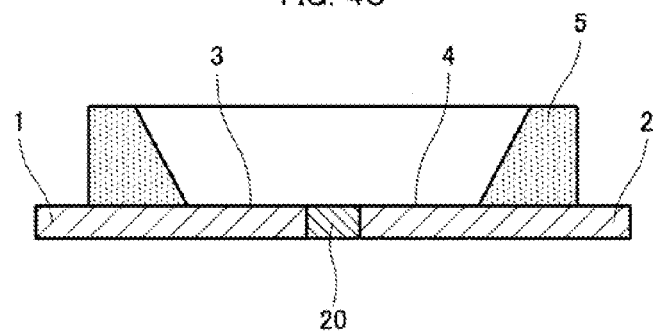

Finally, the unsaturated polyester resin 14 is cured at the mold temperature for about 15 to 30 seconds, and then a molded product is removed from the mold (FIG. 4(c)).

In this way, the optical semiconductor package can be formed with a reflector 5 made of an unsaturated polyester resin having high reflection efficiency and high resistance to deterioration against ultraviolet rays or the like. Thus, even in the case where the optical semiconductor device is caused to emit light for a long time, deterioration of the resin and discoloration caused by deterioration can be suppressed, thereby keeping a high reflectivity and a high rate of emission.

In the case where an unsaturated polyester resin is used, a reactive functional group such as a hydroxyl group (—OH group) is not contained in the unsaturated polyester resin and a chemical bond is not formed with a metal. Thus, a resin burr hardly occurs in a molding process. Even if a resin burr occurs, the burr easily peels off. Since light is reflected in the opening of the reflector 5 in the optical semiconductor package, a surface shape in the opening requires high precision. An epoxy resin is likely to be chemically bonded with a metal, so that a burr is likely to occur. Hence, a burr needs to be removed in the opening of the reflector 5 by a wet or dry process. In contrast, the use of an unsaturated polyester resin can suppress the occurrence of a burr, thereby shortening the process so as to improve productivity. Furthermore, the surfaces of the leads 1 and 2 in the opening of the reflector 5 are not damaged by deburring, thereby keeping a high reflectivity. Thus, an unsaturated polyester resin is particularly suitable for the optical semiconductor package.

Moreover, a thermoplastic resin in the related art has high water absorbency and thus needs to be dried when or before the resin is retained in the hopper. In contrast, an unsaturated polyester resin has low water absorbency of 0.07%, eliminating the need for a drying process. Thus, the optical semiconductor package can be more easily formed.

In the case of a thermoplastic resin (nylon), the resin is injection-molded at 300° C. to 330° C. around a melting point (about 300° C.) Thus, an added organic matter is likely to be carbonized into black spots, increasing the probability of defective molding. In contrast, an unsaturated polyester resin in injection molding has a plasticizing temperature of about 80° C. to 100° C. and thus can be injection-molded at 50° C. to 90° C., thereby suppressing a change of material characteristics and defective molding.

Moreover, an unsaturated polyester resin has a melting temperature of about 50° C. to 90° C. and thus can be cured by heating even in a mold kept at 150° C. to 200° C. for cooling a thermoplastic resin in the related art. Thus, a conventional mold can be used as it is and a thermoplastic resin can be easily replaced with a thermosetting resin.

A thermoplastic resin in the related art has low flowability and thus needs to be injected into the mold at a high pressure. Thus, components for holding the leads 1 and 2 need to be provided in the mold to prevent deformation of the leads 1 and 2. In contrast, an unsaturated polyester resin having higher flowability than a thermoplastic resin can be injection-molded at a lower resin injection pressure than a thermoplastic resin. Thus, the leads 1 and 2 are less likely to be deformed and do not need to be held in injection molding, achieving a simple mold.

In the case where the optical semiconductor package is manufactured using an epoxy resin, the epoxy resin cannot be melted and kneaded in an injection cylinder because the plasticizing temperature and the curing temperature of a typical epoxy resin are generally close to each other. Generally, an epoxy resin is gradually melted and injected by transfer molding. However, a resin injected at a low pressure by transfer molding hardly flows at some points, leading to variations in the hardness of the resin depending on molding areas. Furthermore, at each time of transfer molding, a resin tablet needs to be supplied into a heating chamber in the mold, resulting in a longer molding cycle and lower manufacturing efficiency. A silicone resin is a liquid resin that can be injection-molded but a special line is necessary for the material characteristics of the resin. Thus, a silicone resin is not flexible and requires a large number of times of maintenance, leading to low productivity. In contrast, in the case of an unsaturated polyester resin, the plasticizing temperature and the curing temperature of the resin are not close to each other, so that the unsaturated polyester resin can be melted in the injection cylinder and injected at a high pressure by injection molding. Thus, the resin can evenly flow into the mold with suppressed variations in hardness. Moreover, the molten resin is rapidly cured by heating, achieving resin molding in a short time. Since the optical semiconductor package can be manufactured by injection molding, a molten resin can be retained beforehand in the hopper, allowing optical semiconductor packages to be successively formed with higher production efficiency. Furthermore, typical injection molding equipment can be used without the need for a special line, achieving high flexibility and maintainability. Thus, a reduction in production efficiency can be prevented.

In this embodiment, the reflector 5 and holding resin 20 are molded together. The reflector 5 and the holding resin 20 may be separately molded using different materials.

Also in the case of the formation of resin 6 in an optical semiconductor package not provided with a reflector as illustrated in FIG. 2, the optical semiconductor package can be formed by injection molding with a suitable mold.

Fourth Embodiment

A filler containing glass fibers with long fiber lengths and spherical silica is added to the unsaturated polyester resin of the third embodiment, achieving higher resin strength.

Moreover, the reflectivity of light can be improved by adding titanium oxide.

Maleic anhydride, fumaric acid, styrene, a filling agent, a reinforcing agent, a curing agent, a release agent, a pigment, and other additive agents may be properly combined and added to at least one of the filler and titanium oxide.

For example, the resin contains 15% to 25% of unsaturated polyester components as a main agent, 5%- to 20% of glass fibers, 30% to 40% of titanium oxide, and 20% to 30% of silica as additive agents, and 1% to 3% of other additive agents, thereby improving resistance to deterioration while increasing a reflectivity of light.

In the case where an unsaturated polyester resin is injection-molded as an optical semiconductor package, the hard and brittle unsaturated polyester resin may cause cracks or fractures or may be wound around a screw so as to cause insufficient kneading. The resin may be discolored by rubbing. In the present embodiment, these problems are solved by optimizing resin formulation, for example, the ratio of an unsaturated polyester resin material, the ratio of glass fibers, the ratio of titanium oxide, and the ratio of a release agent, allowing the use of an unsaturated polyester resin for a reflector.

In a method of manufacturing a resin containing these unsaturated polyesters, 15% to 25% of unsaturated polyester components is first added into a container, 5% to 20% of glass fibers, 30% to 40% of titanium oxide, and 20% to 30% of silica are added as additive agents, and 1% to 3% of other additive agents is added before agitation. The resin is molded into a long cylinder and then is cut into pellets, forming a resin material to be supplied into a hopper 12.

Fifth Embodiment

Referring to FIG. 5, the configuration of an optical semiconductor device according to the present invention will be described below.

Figure 5A:
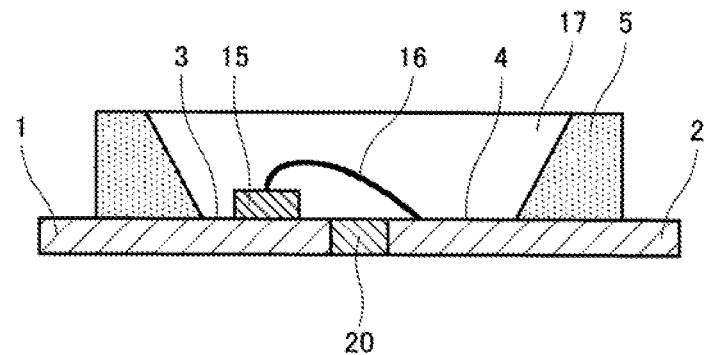
FIG. 5 is a cross-sectional view illustrating the configuration of an optical semiconductor device according to the present invention.
Figure 5B:
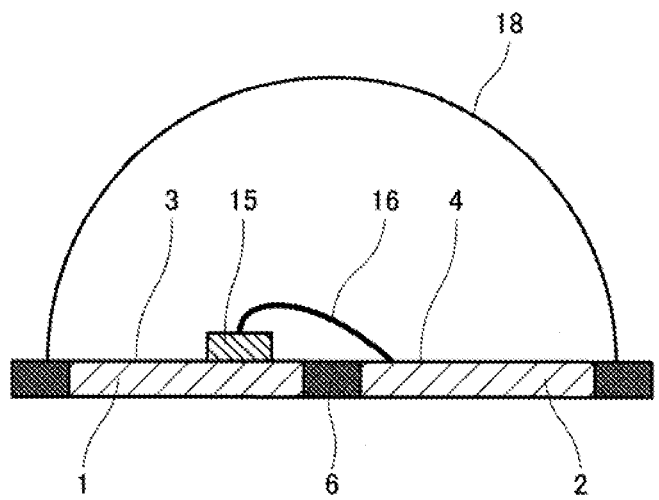
Figure 5C:
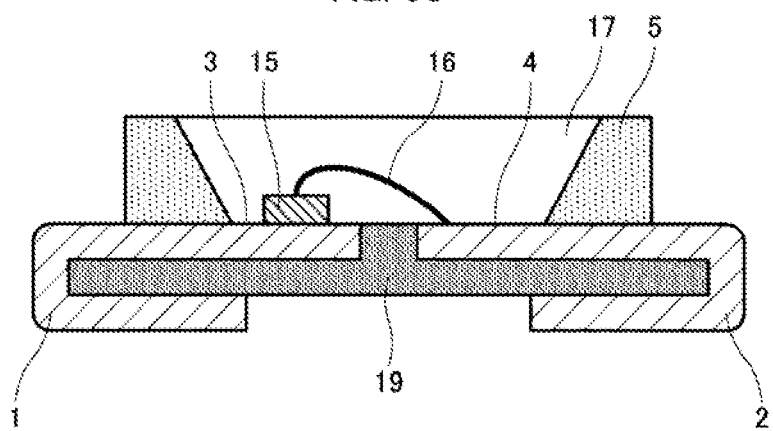

FIG. 5 is a cross-sectional view illustrating the configuration of the optical semiconductor device according to the present invention. FIG. 5(a) illustrates an optical semiconductor device provided with a reflector. FIG. 5(b) illustrates an optical semiconductor device not provided with a reflector. FIG. 5(c) illustrates an optical semiconductor device including holding resin on the back sides of leads.

As illustrated in FIG. 5(a), in the optical semiconductor package provided with the reflector according to the first to fourth embodiments, a semiconductor element 15 is joined onto a mounting region 3 of a lead 1 while the terminals of the semiconductor element 15 and a connecting region 4 of a lead 2 are electrically connected via conductive materials such as wires 16. Moreover, translucent resin 17 is injected into the opening of a reflector 5 so as to seal the semiconductor element 15 and the wires 16. With this configuration, even in the case where the optical semiconductor device is caused to emit light for a long time while keeping the reflectivity of light, deterioration of the reflector 5 or exposed holding resin 20 and discoloration caused by deterioration can be suppressed, thereby keeping a high reflectivity and a high rate of emission.

As illustrated in FIG. 5(b), in the optical semiconductor package not provided with a reflector according to the first to fourth embodiments, the semiconductor element 15 is joined onto the mounting region 3 of the lead 1 while the terminals of the semiconductor element 15 and the connecting region 4 of the lead 2 are electrically connected via conductive materials such as the wires 16. Moreover, a lens 18 is joined onto the leads 1 and 2 so as to cover at least a region surrounding the semiconductor element 15 and the wires 16. With this configuration, even in the case where the optical semiconductor device is caused to emit light for a long time while keeping the reflectivity of light, deterioration of exposed resin 6 and discoloration caused by deterioration can be suppressed, thereby keeping a high reflectivity and a high rate of emission.

Furthermore, resin for holding the leads 1 and 2 can be provided on the back sides opposed to the major surfaces of the leads 1 and 2.

For example, as illustrated in FIG. 5(*c*), in the optical semiconductor package provided with the reflector according to the first to fourth embodiments, resin 19 for holding the leads 1 and 2 can be also provided on the back sides opposed to the major surfaces of the leads 1 and 2. In this case, the leads 1 and 2 are not exposed on the back sides and thus the leads 1 and 2 may be folded to form terminals along the resin 19 on the back sides or gull-wing terminals. In the optical semiconductor package thus formed, the semiconductor element 15 is joined onto the mounting region 3 of the lead 1 while the terminals of the semiconductor element 15 and the connecting region 4 of the lead 2 are electrically connected via conductive materials such as the wires 16. Moreover, the translucent resin 17 is injected into the opening of the reflector 5 so as to seal the semiconductor element 15 and the wires 16. With this configuration, even in the case where the optical semiconductor device is caused to emit light for a long time while keeping the reflectivity of light, deterioration of the reflector 5 or the exposed holding resin 20 and discoloration caused by deterioration can be suppressed, thereby keeping a high reflectivity and a high rate of emission.

INDUSTRIAL APPLICABILITY

The present invention is useful for, for example, an optical semiconductor package in which deterioration of resin can be reduced to suppress a reduction in reflectivity, leads are held by the resin, and a mounting region for an optical semiconductor element is provided on the leads, a method of manufacturing the same, and an optical semiconductor device.

The invention claimed is:

1. An optical semiconductor package, comprising:
    a first lead having a mounting region for an optical semiconductor element on a major surface of the first lead;
    at least one second lead having a connecting region for a conductive material on a major surface of the second lead, the conductive material being used for conduction with the optical semiconductor element;
    a holding resin that adjoins and holds the mounting region of the first lead and the connecting region of the second lead; and
    a reflector disposed on top of the surfaces of the first lead and the second lead and surrounding a perimeter of the mounting region and the connecting region, wherein
    the holding resin and the reflector are formed as a single, injection molded structure with an unsaturated polyester resin, and the unsaturated polyester resin contains a filler composed of glass fibers and spherical silica, titanium oxide, and any additive agent and satisfies: $15\% < A < 25\%$, $5\% < B < 20\%$, $30\% < C < 40\%$, $20\% < D < 30\%$, $1\% < E < 3\%$, and $A+B+C+D+E=100\%$ where A is a component ratio of the unsaturated polyester resin, B is a component ratio of the glass fibers, C is a component ratio of the titanium oxide, D is a component ratio of the silica, and E is a component ratio of the additive agent.

2. A method of manufacturing the optical semiconductor package according to claim 1, comprising:
    placing the first lead and the second lead in a mold;
    injecting a thermosetting resin into the mold to mold the holding resin and the reflector by injection molding; and
    curing the thermosetting resin,
    wherein the thermosetting resin is the unsaturated polyester resin, the mold is kept at 150° C. to 200° C., and the thermosetting resin is heated to 50° C. to 90° C. when injected into the mold.

\* \* \* \* \*